US012777986B2

(12) United States Patent
Patil et al.

(10) Patent No.: US 12,777,986 B2
(45) Date of Patent: Oct. 27, 2026

(54) INTEGRATED CIRCUIT DEVICE HAVING A SUBSTRATE WITH A STEPPED CONFIGURATION TO ACCOMMODATE AT LEAST TWO DIFFERENT SOLDER BALL SIZES

(71) Applicant: QUALCOMM Incorporated, San Diego, CA (US)

(72) Inventors: Aniket Patil, San Diego, CA (US); Manuel Aldrete, Encinitas, CA (US); Zhijie Wang, San Diego, CA (US); Piyush Gupta, San Diego, CA (US); Rajneesh Kumar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 424 days.

(21) Appl. No.: 18/457,162

(22) Filed: Aug. 28, 2023

(65) Prior Publication Data

US 2025/0079277 A1 Mar. 6, 2025

(51) Int. Cl.

| | |
|---|---|
| ***H10W 90/00*** | (2026.01) |
| ***H10B 80/00*** | (2026.01) |
| ***H10W 70/05*** | (2026.01) |
| ***H10W 74/10*** | (2026.01) |

(52) U.S. Cl.
CPC .......... *H10W 90/701* (2026.01); *H10B 80/00* (2023.02); *H10W 70/093* (2026.01); *H10W 74/117* (2026.01); *H10W 90/00* (2026.01); *H10W 90/724* (2026.01)

(58) Field of Classification Search
CPC .... H10W 70/65; H10W 90/701; H10W 70/68
USPC .......................................................... 257/668
See application file for complete search history.

(56) References Cited

U.S. PATENT DOCUMENTS

| | | | | |
|---|---|---|---|---|
| 10,952,319 | B1 * | 3/2021 | Lee | H05K 1/0204 |
| 2018/0090429 | A1 * | 3/2018 | Kobayashi | H10P 54/00 |
| 2018/0182735 | A1 * | 6/2018 | Leuten | H10W 70/65 |
| 2021/0183755 | A1 | 6/2021 | Ong et al. | |
| 2021/0183777 | A1 | 6/2021 | Yim et al. | |
| 2022/0068764 | A1 * | 3/2022 | Lim | H10W 20/023 |
| 2022/0189835 | A1 | 6/2022 | Yim et al. | |
| 2022/0406753 | A1 | 12/2022 | Cheah et al. | |

OTHER PUBLICATIONS

International Search Report and Written Opinion—PCT/US2024/037885—ISA/EPO—Dec. 13, 2024.

* cited by examiner

*Primary Examiner* — Moazzam Hossain
(74) *Attorney, Agent, or Firm* — Moore IP

(57) ABSTRACT

An integrated circuit (IC) device includes a substrate. The substrate includes a first side having a stepped configuration having a first surface that is elevated relative to a second surface. The first surface includes first solder resist openings (SROs), and the second surface includes second SROs. The IC device includes a first set of solder balls electrically connected to a first set of contacts in the first SROs. A solder ball of the first set of solder balls has a first characteristic dimension. The IC device also includes a second set of solder balls electrically connected to a second set of contacts in the second SROs. A solder ball of the second set of solder balls has a second characteristic dimension larger than the first characteristic dimension.

30 Claims, 7 Drawing Sheets

INTEGRATED CIRCUIT DEVICE HAVING A SUBSTRATE WITH A STEPPED CONFIGURATION TO ACCOMMODATE AT LEAST TWO DIFFERENT SOLDER BALL SIZES

FIELD

Various features relate to an integrated circuit device having a substrate with a stepped configuration to accommodate at least two different solder ball sizes.

BACKGROUND

Electrical connections exist at each level of a system hierarchy of an integrated circuit (IC) device. The electrical connections include interconnections of an IC device. The interconnections connect first contacts on a first substrate to second contacts on a second substrate. The first substrate can be an interposer coupled to one or more first ICs (e.g., one or more first dies) that enables the first substrate to be electrically connected via the interconnections to the second substrate, which can be a circuit board (e.g., a printed circuit board) or another interposer coupled to one or more second ICs (e.g., one or more second dies). The interconnections include power delivery interconnections to a power delivery network, input/output (I/O) interconnections, or both. The number of interconnections is limited by a package size of the IC device, current carrying capacity of one or more of the interconnections, and reliability of the IC device due to heat dissipation characteristics, mechanical stress on the interconnections, or both. Functionality of the IC device may be limited by a count of the I/O interconnections.

State-of-the-art mobile application devices demand a small form factor, low cost, a tight power budget, reliability, and high electrical performance. Mobile package design for an IC device has evolved to meet divergent goals for enabling mobile applications that support multimedia enhancements. In particular, a size of solder balls of a ball grid array that form interconnections is selected to balance board level reliability, which increases with larger size balls and smaller package size, with a number of available connections, which increases with smaller ball size or larger package size. It is desirable to produce a reliable integrated circuit device with a high count of interconnections.

SUMMARY

Various features relate to integrated circuit devices.

One example provides an IC device that includes a substrate. The substrate includes a first side having a stepped configuration having a first surface that is elevated relative to a second surface. The first surface includes first solder resist openings (SROs), and the second surface includes second SROs. The IC device includes a first set of solder balls electrically connected to a first set of contacts in the first SROs. A solder ball of the first set of solder balls has a first characteristic dimension. The IC device also includes a second set of solder balls electrically connected to a second set of contacts in the second SROs. A solder ball of the second set of solder balls has a second characteristic dimension larger than the first characteristic dimension.

Another example provides a device. The device includes a substrate. The substrate includes a first side having a stepped configuration having a first surface that is elevated relative to a second surface. The first surface includes first SROs, and the second surface includes second SROs. The device includes a first set of solder balls electrically connected to a first set of contacts in the first SROs. A solder ball of the first set of solder balls has a first characteristic dimension. The device includes a second set of solder balls electrically connected to a second set of contacts in the second SROs. A solder ball of the second set of solder balls has a second characteristic dimension larger than the first characteristic dimension. The device includes a die electrically connected to a second side of the substrate. The device includes a mold compound coupled to the second side and at least partially encapsulating the die. The device also includes a second substrate coupled to the mold compound. The second substrate includes a third set of contacts configured to be electrically connected to a fourth set of contacts of a second device.

Another example provides a method of fabricating an IC device. The method includes providing a substrate. The substrate includes a first side having a stepped configuration having a first surface that is elevated relative to a second surface. The first surface includes first SROs, and the second surface includes second SROs. The method includes electrically connecting a first set of solder balls to a first set of contacts in the first SROs. A solder ball of the first set of solder balls has a first characteristic dimension. The method also includes electrically connecting a second set of solder balls to a second set of contacts in the second SROs, A solder ball of the second set of solder balls has a second characteristic dimension larger than the first characteristic dimension.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

Figure 1A:
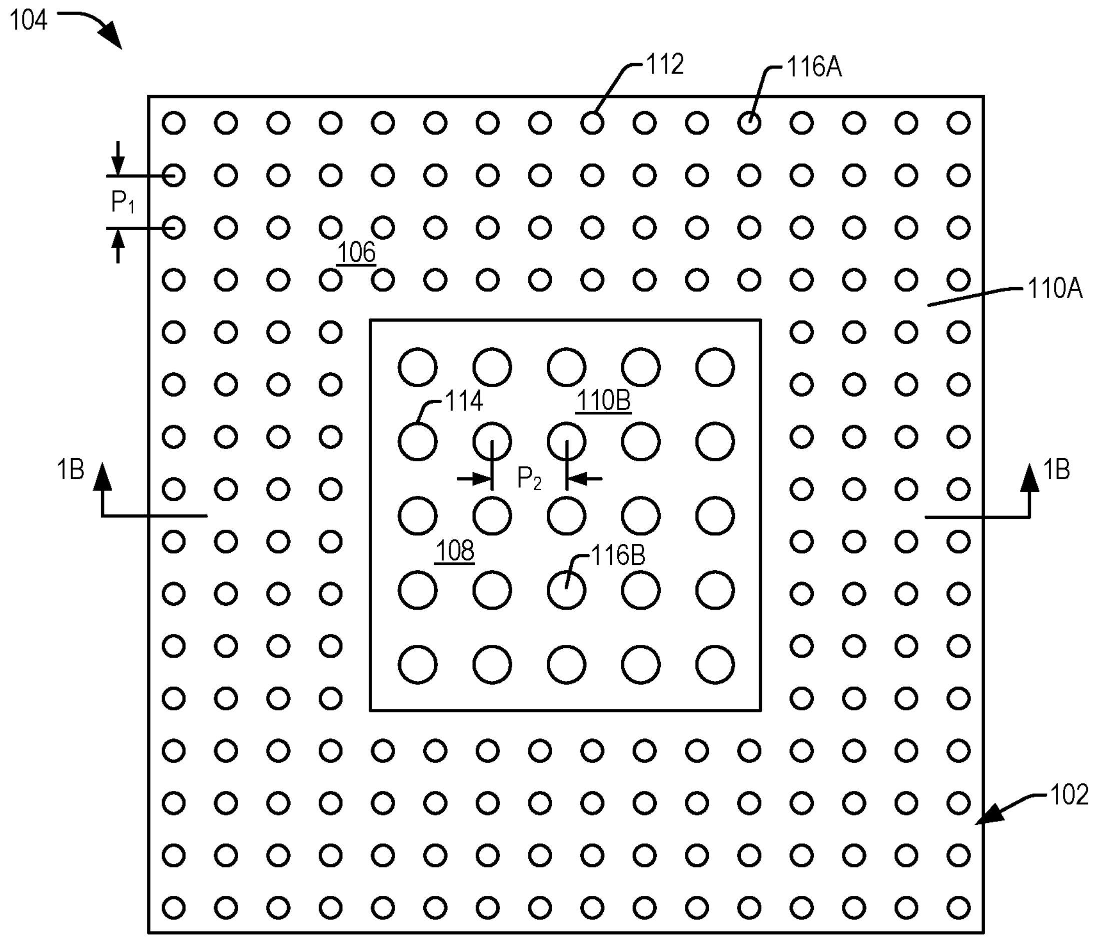
FIG. 1A illustrates a plan view of an exemplary substrate for an IC device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

As used herein, the terms "comprise," "comprises," and "comprising" may be used interchangeably with "include," "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

Improvements in manufacturing technology and demand for lower cost and more capable electronic devices has led to increasing complexity of IC devices. The increasing complexity of IC devices includes resolving conflicts between package size and a number of interconnections needed to support power delivery and I/O demands. The interconnections for a device include I/O interconnections and power delivery interconnections that provide power to a power delivery network. A small package size increases reliability of an IC device at least by limiting potential heat warpage, but the small size also limits a number of interconnections that the IC device can have. An IC device with a ball grid array (BGA) having solder balls with a small size allows for a large number of interconnections as compared to the use of a BGA with solder balls of a larger ball size, but the small solder ball size can cause issues associated with reliability and current carrying capacity.

Interconnections for IC devices of the present disclosure include interconnections provided by a first set of solder balls of a first BGA and by a second set of solder balls of a second BGA. The interconnections electrically connect contacts of a first substrate to contacts of a second substrate. A solder ball of the first set has a first characteristic dimension that is smaller than a second characteristic dimension of a solder ball of the second set. A pitch of the first BGA (e.g., a distance from a center of an SRO to a center of a nearest SRO) may be less than a pitch of the second BGA. The smaller pitch of the first BGA enables a number of interconnections to be greater than the number of interconnections available if only the second pitch were utilized (i.e., the number of solder balls of the first set per unit area is greater than the number of solder balls of the second set per unit area). A characteristic dimension of a solder ball before a reflow process is a diameter of the solder ball. After a reflow process deforms the solder ball during electrical connection of the solder ball to a contact, the characteristic dimension is a largest dimension of the solder ball parallel to the contact.

The larger second characteristic dimension allows interconnections formed by the solder balls of the second BGA to handle more current than the interconnections formed by the solder balls of the first BGA and provides increased reliability due to mechanical stability and stress handling capability provided by larger connection surface areas of the solder balls of the second set to the first substrate and to the second substrate as compared to the connection surface areas for solder balls of the first set to the first substrate and the second substrate. The presence of the first BGA and the second BGA allows the IC device formed by electrically connecting the first substrate to the second substrate via the ball grid arrays to be reliable and allows the IC device to have a large number of interconnections.

In some implementations, the first BGA is located around a perimeter of the second BGA, and in other implementations, the second BGA is located around a perimeter of the first BGA. Other arrangements of the first BGA to the second BGA can also be utilized.

In some implementations, additional interconnections are provided by one or more additional BGAs. A solder ball associated with a particular BGA of the one or more additional BGAs may have the first characteristic dimension, the second characteristic dimension, or a different characteristic dimension.

First sides of each of the first substrate and the second substrate include contacts in first SROs for the first set of solder balls and contacts in second SROs for the second set of solder balls. The first SROs of the first substrate and the second substrate are sized to accommodate the solder balls of the first set of solder balls. The second SROs of the first substrate and the second substrate are sized to accommodate the solder balls of the second set of solder balls.

The first side of the first substrate has a stepped configuration that includes a first surface elevated relative to a second surface. The first SROs are located in the first surface and the second SROs are located in the second surface. The first substrate may include one or more additional surfaces that are elevated or recessed relative to the first surface or the second surface. A particular surface of the one or more additional surfaces may include SROs for solder balls of an additional BGA, or the particular surface may not include a solder resist layer, SROs, or both.

The first characteristic dimension of the solder balls of the first set, the second characteristic dimension of the solder balls of the second set, sizes of the first SROs and the second SROs of the first substrate, and an elevation difference between the first surface and the second surface of the first substrate are selected so that, if the solder balls are electrically connected to the first substrate before being electrically coupled to the second substrate, distal ends of the solder balls are coplanar, or nearly coplanar, to simplify connection to the second substrate. The distal ends are ends of the solder balls farthest away from contacts in the SROs that the solder balls are connected to. The first side of the second substrate includes a planar surface with the first SROs and the second SROs in the planar surface in locations that correspond to the locations of the first SROs and the second SROs on the first side of the first substrate. Interconnections are formed between the first substrate and the second substrate by electrically connecting the first solder balls and the second solder balls to the contacts of the first substrate and the second substrate (e.g., by reflow processes).

In some implementations, one or more devices may be located in the portion of the first substrate associated with the first surface because of a thickness of the first substrate due to the elevation of the first surface relative to the second surface. For example, the elevation of the first surface may allow one or more deep trench capacitors (DTCs) to be located in the first substrate between the first surface and a second side of the first substrate.

The first substrate includes a number of metal layers. The number of metal layers of a first portion of the first substrate associated with the elevated first surface may include at least one additional metal layer more than a second portion of the first substrate associated with the second surface. For example, in a particular implementation, the first portion of the first substrate associated with the first surface includes four metal layers and the second portion of the first substrate associated with the second surface includes three metal layers. The at least one extra metal layer associated with the first portion of the first substrate provides additional options for signal connectivity, or power distribution if used for one or more power interconnections, as compared to connectivity options available with at least one less metal layer. Providing power delivery via the portion of the first substrate with at least one less metal layer can be more efficient (e.g., greater current capacity and less noise due to shorter travel distances) than having power delivery via the portion of the first substrate with at least one additional metal layer. In some implementations, the first substrate is a coreless substrate without a core and in other implementations, the first substrate includes a core.

In some implementations, one or more devices, such as a landside component (LSC) (e.g., a capacitor), are electrically connected to one or more contacts in SROs of the first substrate. The second surface of the first substrate is recessed relative to the first surface. The recess allows the LSC to be thicker than if the LSC is coupled to one or more contacts on the first surface. Also, having the larger interconnections with the second characteristic dimension surrounding the LSC rather than the interconnections having the first characteristic dimension reduces the stress applied to the interconnections surrounding the LSC and provides better reliability for the IC device.

Interconnections formed by the solder balls of the first BGA, the second BGA, or both, include power delivery network interconnections, include I/O interconnections, or both. A plurality of conductors of the substrate that connect contacts on the first side of the first substrate to contacts in the second side of the substrate can receive power via power delivery network interconnections formed from one or more solder balls of the second set, one or more solder balls of the first set, or both, and deliver power to a power delivery network of a die electrically connected to the second side of the first substrate. The I/O interconnections connected to the first substrate provide data signals to conductors of the first substrate, receive signals from conductors of the substrate, or both.

In some implementations, a die (e.g., an IC) is electrically connected to the second side of the first substrate. In some implementations, all or a majority of the second surface of the first substrate is located in a die shadow of the die. In other implementations, none or less than a majority of the second surface of the first substrate is located in the die shadow of the die.

Exemplary Substrates

Figure 1B:
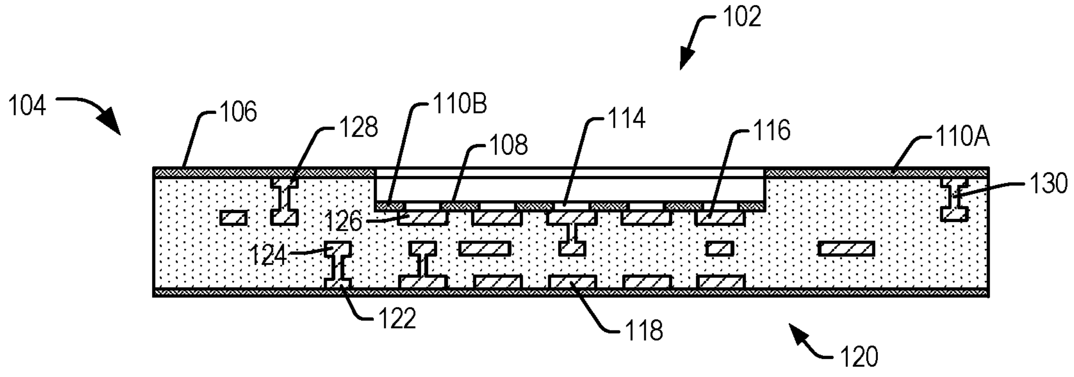
FIG. 1B illustrates a cross-sectional profile view of the exemplary substrate of FIG. 1A taken substantially along cutting plane 1B-1B of FIG. 1A.

FIG. 1A illustrates a plan view of an exemplary first side 102 of a substrate 104 for an IC device. FIG. 1B illustrates a cross-sectional profile view of the substrate 104 taken substantially along cutting plane 1B-1B of FIG. 1A. The substrate 104 includes a first surface 106 that is elevated relative to a second surface 108. The first surface 106 includes a solder resist layer 110A having first SROs 112 and the second surface 108 includes a solder resist layer 110B having second SROs 114. Contacts 116A of a first set of contacts accessible from the first side 102 of the substrate 104 are located in the SROs 112, and contacts of a second set of contacts accessible from the first side 102 of the substrate 104 are located in the second SROs 114. The contacts 116 may be solder mask defined pads (as shown) or non-solder mask defined pads that reside on a lower surface of the substrate 104 in the SROs 112, 114.

The first SROs 112 are sized to receive solder balls having a first characteristic dimension. The second SROs 114 are sized to receive solder balls having a second characteristic dimension that is larger than the first characteristic dimension. The first set of solder balls and the second set of solder balls are electrically connected to the contacts 116 (e.g., by a reflow process).

Each of the SROs 112, 114 may be arranged in a pattern, such as a square pattern (as shown), a rectangular pattern, an equilateral triangle pattern, another type of regular or irregular pattern, or combinations thereof. For SROs 112, 114 arranged in a square pattern or an equilateral triangle pattern, centers of adjacent first SROs 112 are separated by a first pitch distance P1, and centers of adjacent second SROs 114 are separated by a second pitch distance P2. Having a smaller first pitch distance P1 allows the first side 102 to have significantly more SROs 112, 114 than if only the larger second pitch distance P2 is utilized. For example, for the particular exemplary substrate 104 of FIG. 1A using a square pattern, a count of the SROs 112, 114 is 217 (i.e., 192 first SROs 112 and 25 second SROs) when the pitch distances P1, P2 are used as compared to a count of 121 for second SROs 114 when only the second pitch distance P2 is used, which results in 96 additional SROs 112, 114 when the smaller pitch distance P1 and the larger pitch distance P2 are used. For SROs 112, 114 in a rectangular pattern, a horizontal pitch distance of the first SROs 112 can be smaller than a horizontal pitch distance of the second SROs 114, a vertical pitch distance of the first SROs 112 can be smaller than a vertical pitch distance of the second SROs 114, or both, to result in more SROs 112, 114 for the substrate 104 than if only the horizontal pitch distance and the vertical pitch distance of the second SROs 114 are used.

The substrate 104 includes conductive pathways from the contacts 116 of the first set of contacts and the second set of contacts to contacts 118 of a third set of contacts accessible from a second side 120 of the substrate 104. The conductive pathways are formed by conductive paths in particular metal layers of a plurality of metal layers in the substrate 104 and by conductors 130 that join different metal layers together. The stepped configuration of the first side 102 of the substrate 104 enables the substrate 104 to have one or more extra metal layers for the portion of the substrate 104 associated with the first surface 106 that is elevated relative to the second surface 108. For example, the exemplary substrate 104 shown in FIG. 1B has three metal layers 122-126 for the portion of the substrate associated with the second SROs 114 (i.e., a first metal layer 122 associated with the contacts 118 of the second set of contacts accessible from the second side 120 of the substrate 104, a second metal layer 124 between the first metal layer 122 and a third metal layer 126 associated with a first portion of the contacts 116 of the first set of contacts located in the second SROs 114). The substrate 104 has four metal layers 122-128 for the portion of the substrate 104 associated with the SROs 112 (i.e., the first metal layer 122, the second metal layer 124, the third metal layer 126, and a fourth metal layer 128). Having the four metal layers 122-128 may expand a number of options for pathways to connect particular contacts 118 of the second set of contacts with particular contacts 116 of the first set of contacts. In some implementations (e.g., as shown in FIG. 1B), the substrate 104 is a coreless substrate 104 that does not include a core, and in other implementations, the substrate 104 is a substrate with a core.

The first SROs 112 of FIG. 1A are arranged around a perimeter of the second SROs 114 and substantially all available surface area of the first side 102 is filled with patterns of the SROs 112, 114. In other implementations, the first side 102 of the substrate 104 may include a different number of SROs 112, 114; the first SROs 112 may be in a different arrangement relative to the second SROs 114; only a portion of the available surface area of the first side 102 may include patterns of SROs 112, 114; the stepped configuration of the first side 102 may include one or more additional surfaces and may include at least one additional SRO associated with a particular surface of the one or more additional surfaces; one or more components (e.g., capacitors) may be connected to the first surface; one or more components may be connected to the second surface; or combinations thereof.

Figure 2:
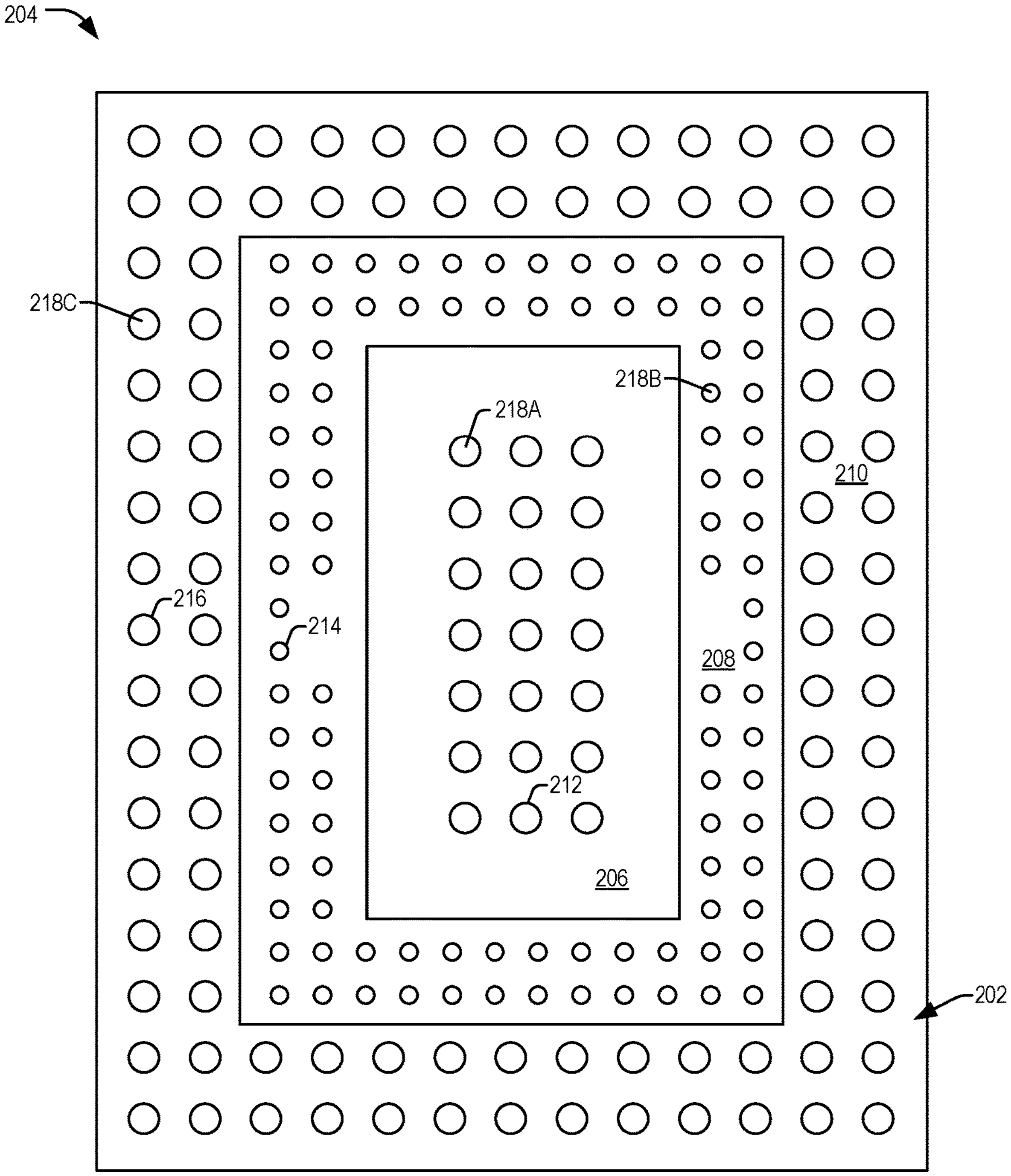
FIG. 2 illustrates a plan view of an exemplary substrate for an IC device.

For example, FIG. 2 illustrates a plan view of an exemplary first side 202 of a substrate 204 for an IC device. The first side 202 has a stepped configuration having a first surface 206 that is recessed relative to a second surface 208, and a third surface 210 that is recessed relative to the second surface 208. The first surface 206 includes first SROs 212, the second surface 208 includes second SROs 214, and the third surface 210 includes third SROs 216. The second SROs 214 are located around a perimeter of the first SROs 212, and the third SROs 216 are located around a perimeter of the second SROs 214. Contacts 218A. 218B, 218C accessible from the first side 202 are located in respective SROs 212, 214, 216.

The first SROs 212 and the third SROs 216 are sized to receive solder balls having a first characteristic dimension. In other implementations, the third SROs may be sized to receive solder balls having a different characteristic dimension than the first characteristic dimension. The second SROs 114 are sized to receive solder balls having a second characteristic dimension that is smaller than the first characteristic dimension.

Figure 3:
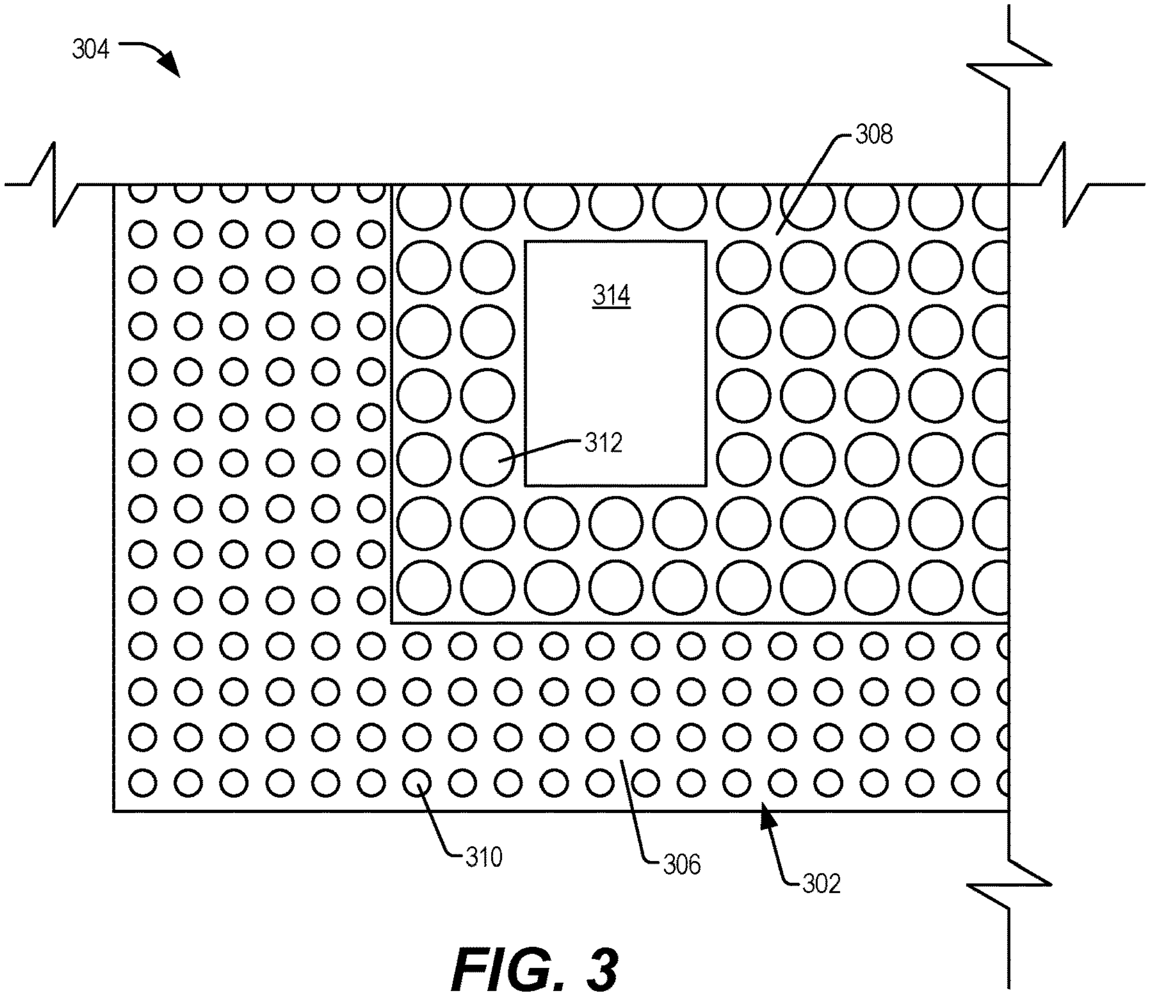
FIG. 3 illustrates a plan view of a portion of an exemplary substrate with connected solder balls for an IC device.

As another example, FIG. 3 illustrates a plan view of a portion of an exemplary first side 302 of a substrate 304 for an IC device. The first side 302 has a stepped configuration having a first surface 306 that is elevated relative to a second surface 308. Solder balls 310 are electrically connected to contacts in first SROs in the first surface 306, and solder balls 312 are electrically connected to contacts in second SROs in the second surface 308. The solder balls 310 have a first characteristic dimension that is smaller than a second characteristic dimension of the solder balls 312.

In addition to the solder balls 312, a landside component (LSC) 314 is connected to the substrate 304 within the area defined by the second surface 308. The LSC 314 is electrically connected to interconnects of the substrate 304. The LSC 314 may be a capacitor or another type of device. The LSC 314 may have a thickness greater than the characteristic dimension of the solder balls 310. Additional LSCs may be electrically connected to interconnects of the substrate 304 within the area defined by the second surface 308 at other locations. Electrically connecting the LSC 314 within the area defined by the second surface 308, which is recessed relative to the first surface 306, allows the LSC 314 to have a larger thickness and a smaller package size than another LSC that is configured to serve the same function as the LSC 314 and is also configured to be electrically connected to interconnects of the substrate 304 within the area defined by the first surface 306.

Exemplary IC Devices

Figure 4:
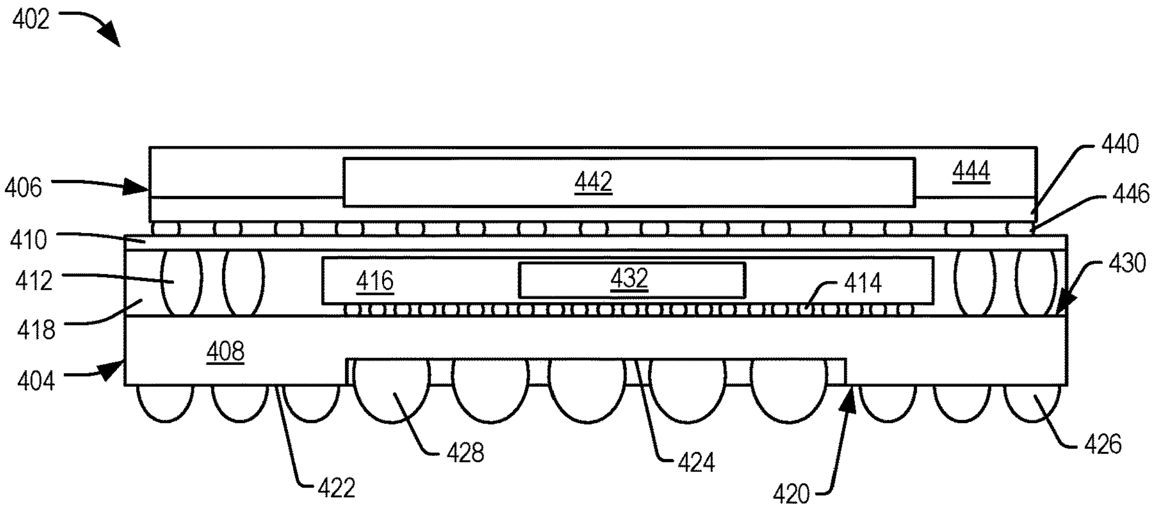
FIG. 4 illustrates a block representation of a cross section of an exemplary IC device.

FIG. 4 illustrates a block representation of a cross section of an IC device 402. The representation of FIG. 4 is simplified for clarity by not including cross section lines, lines representing solder resist layers, metal layers and connectors in substrates 408, 410, 440, and by omitting solder balls 426 extending past a first surface 422 behind depicted solder balls 428.

The IC device 402 includes a first IC device 404 and a second IC device 406 coupled to the first IC device 404 in a stacked fashion. In some implementations, the first IC device 404 is a logic device (e.g., a processor) and the second IC device 406 is a memory device (e.g., a dynamic random-access memory (DRAM) device) that facilitates functionality of the first IC device 404.

The first IC device 404 includes a first substrate 408, a second substrate 410, first interconnects 412, second interconnects 414, a first die 416 (i.e., an IC), and mold compound 418. The first substrate 408 is configured to couple the IC device 402 to one or more other devices (e.g., a circuit board or another IC device) and the second substrate 410 is configured to couple the first IC device 404 to the second IC device 406.

The first substrate 408 includes a first side 420. The first side 420 has a stepped configuration having a first surface 422 and a second surface 424. Solder balls 426 of a first set of solder balls are electrically connected to contacts in first SROs in the first surface 422, and solder balls 428 of a second set of solder balls are electrically connected to contacts in second SROs in the second surface 424. The solder balls 426 have a first characteristic dimension that is less than a second characteristic dimension of the solder balls 428.

A size of an elevation change from the first surface 422 to the second surface 424, sizes of the first SROs, sizes of the second SROs, the first characteristic dimension, and the second characteristic dimension are selected so that distal ends of the solder balls 426, 428 are coplanar, or nearly coplanar within an acceptable error margin, to enable the solder balls 426, 428 to be connected (e.g., by a reflow process) to contacts of a device to which the IC device 402 is to be electrically connected. In some implementations (e.g., the implementation depicted in FIG. 6), the first side 420 of the first substrate 408 is a planar surface, distal ends of the solder balls 428 extend past distal ends of the solder balls 426, and the particular substrate that the IC device 402 is to be electrically connected to includes a stepped configuration that enables the solder balls 426, 428 to be electrically connected to corresponding contacts of the particular substrate (e.g., by the reflow process).

A second side 430 of the first substrate 408 includes a second set of contacts. The second set of contacts, which are electrically connected by connectors in the first substrate 408 to contacts of the first set of contacts on the first side 420 of the first substrate 408, include a first portion of contacts that electrically connect the first die 416 to the first substrate 408 via the second interconnects 414. The second set of contacts also includes a second portion of contacts electrically connected to the first interconnects 412. The first interconnects 412 are also electrically connected to contacts of a third set of contacts accessible from a first side of the second substrate 410. The third set of contacts are electrically connected by connectors in the second substrate 410 to a fourth set of contacts accessible from a second side of the second substrate 410. The second substrate 410 is positioned on and coupled to the mold compound 418. The mold compound 418 encapsulates, or at least partially encapsulates, the first die 416, the first interconnects 412, and the second interconnects 414.

The first die 416 includes a power delivery network 432. In some implementations, one or more of the solder balls 428 provide current to the power delivery network 432. Use of one or more of the solder balls 428 to provide current to the power delivery network 432 may be more efficient and generate less noise than using current delivery via one or more of the solder balls 426 due to larger current carrying capacity of the solder balls 428 and a shorter travel path from the solder balls 428 to the power delivery network 432.

As depicted in FIG. 4, the first die 416 may be positioned above the second surface 424 of the first substrate 408 so that the second surface 424 and the solder balls 428 are in a die shadow of the first die 416. In other implementations, only a portion of the second surface 424 and the second solder balls 428, or none of the second surface 424 and the second solder balls 428, may be in the die shadow of the first die 416.

The second IC device 406 includes a third substrate 440, a second die 442, and mold compound 444. A third set of interconnects electrically connect the second die 442 to the third substrate 440. The mold compound 444 at least partially encapsulates the second die 442 and the third set of interconnects.

Interconnects 446 electrically connect contacts of the second substrate 410 accessible from the second side of the second substrate 410 with contacts of the third substrate 440 accessible from a first side of the third substrate 440. In some implementations, the interconnects 446 are formed from solder balls that all have a particular characteristic dimension. In other implementations a first portion of the interconnects 446 are formed from solder balls having a first particular characteristic dimension that is smaller than a second characteristic dimension of a second portion of the interconnections 446. The second substrate 410 or the third substrate 440 has a stepped configuration configured to accommodate the different sizes of the solders balls of the first portion and the second portion.

Figure 5:
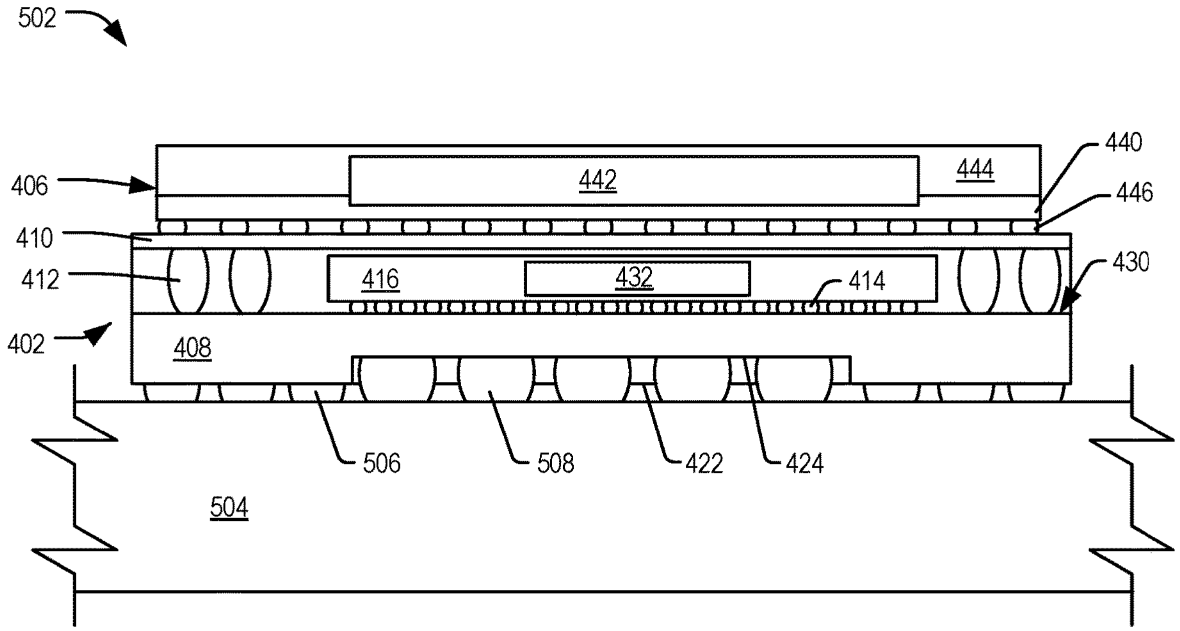
FIG. 5 illustrates the block representation of the cross section of the exemplary device of FIG. 4 connected to a second substrate.

FIG. 5 illustrates a block representation of a cross section of an IC device 502 that includes the IC device 402 of FIG. 4 connected to a particular substrate 504. Similar to FIG. 4, the representation of FIG. 5 is simplified for clarity by not including cross section lines, lines representing solder resist layers, metal layers and connectors in substrates 408, 410, 440, 504, and by omitting interconnections 506 extending past a first surface 422 behind depicted interconnections 508.

The substrate 408 includes a stepped configuration with the first surface 422 elevated relative to the second surface 424 such that a thickness of the substrate 408 from the first surface 422 to the second side 430 of the substrate 408 is greater than a thickness of the substrate 408 from the second surface 424 to the second side 430. A first set of interconnections 506 electrically connect contacts in SROs in the first surface 422 of the first substrate 408 to corresponding contacts in SROs of the particular substrate 504. A second set of interconnections 508 electrically connect contacts in SROs in the second surface 422 of the first substrate 408 to corresponding contacts in SROs of the particular substrate 504. The first set of interconnections 506 are formed from the solder balls 426 of FIG. 4, and the second set of interconnections 508 are formed from the solder balls 428 of FIG. 4.

Figure 6:
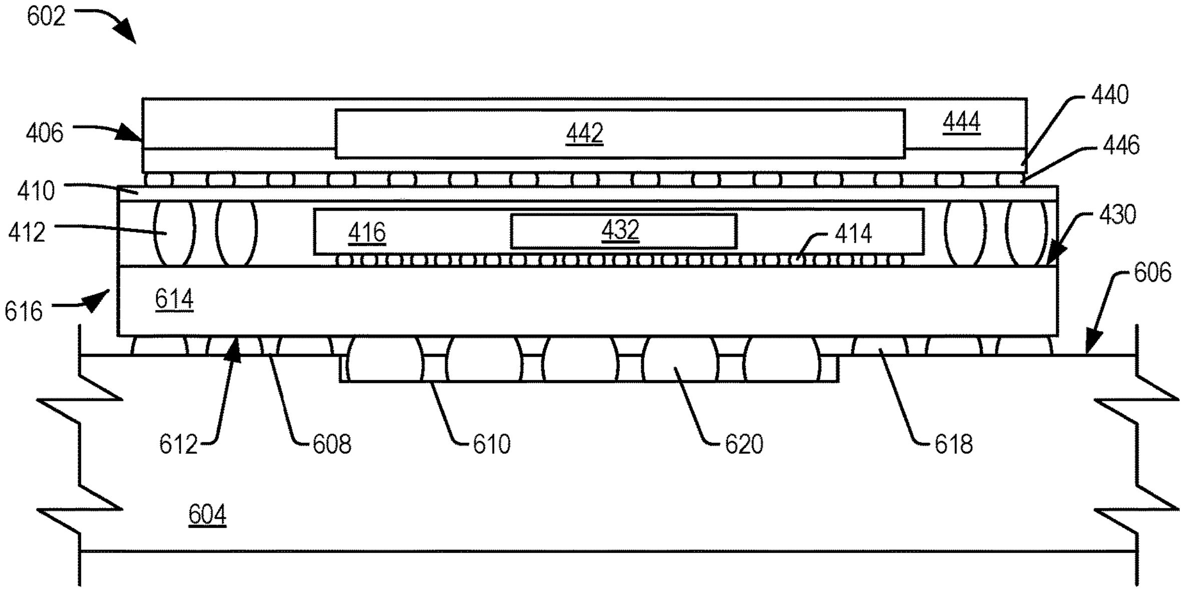
FIG. 6 illustrates a block representation of a cross section of an exemplary IC device connected to a second substrate.

FIG. 6 illustrates a block representation of a cross section of IC device 602. Similar to FIG. 5, the representation of FIG. 6 is simplified for clarity by not including cross section lines, lines representing solder resist layers, metal layers and connectors in substrates 614, 410, 440, 604, and by omitting interconnections 618 extending past a first surface 608 behind depicted interconnections 620.

The IC device 602 has a particular substrate 604 with a first side 606 having a stepped configuration with a first surface 608 that is elevated relative to a second surface 610. Contacts in SROs of a planar first side 612 of a substrate 614 of an IC device 616 are electrically connected via a first set of interconnections 618 to corresponding contacts in SROs in the first surface 608 of the particular substrate 604. Also, contacts in SROs of the planar first side 612 of the substrate 614 are electrically connected via a second set of interconnections 620 to corresponding contacts in SROs in the second surface 610 of the particular substrate 604. The IC device 616 is similar to the IC device 402 of FIG. 4 and FIG. 5 but with the stepped configuration substrate 408 replaced with the substrate 614 having the planar first side 612.

Figure 7:
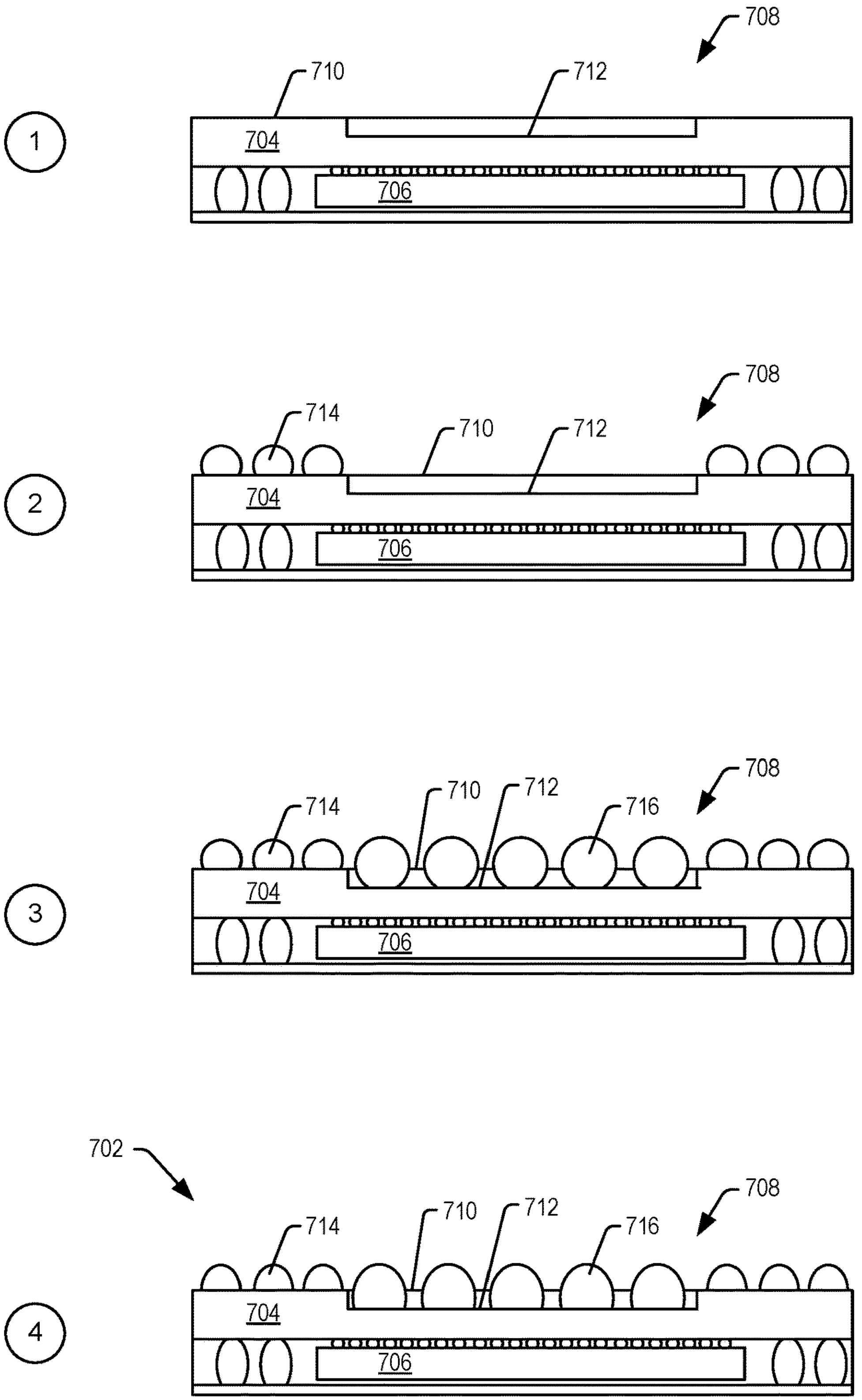
FIG. 7 illustrates an exemplary sequence for fabricating an IC device.

Exemplary Sequence for Fabricating an IC Device Having a Substrate With a Configuration to Accommodate at Least Two Different Solder Ball Sizes In some implementations, fabricating an IC device having a substrate with a stepped configuration to accommodate at least two different solder ball sizes includes several processes. FIG. 7 illustrates an exemplary sequence for providing or fabricating an IC device 702.

It should be noted that the sequence of FIG. 7 may combine one or more stages in order to simplify and/or clarify the sequence for providing or fabricating the IC device 702. In some implementations, the order of the processes may be changed or modified. For example, in the sequence described below, Stage 3 can be performed before Stage 2. In some implementations, one or more of the processes may be replaced or substituted without departing from the scope of the disclosure. In the following description, reference is made to various illustrative Stages of the sequence, which are numbered (using circled numbers) in FIG. 7. The illustrations are block diagrams that show a subset of all features that would be present in corresponding views. Each of the various stages of the sequence illustrated in FIG. 7 shows a single IC device 702 being formed. In other implementations, a plurality of IC devices can be formed concurrently.

Stage 1 of FIG. 7 illustrates a state after formation of a first substrate 704 coupled to a die 706. The first substrate 704 includes a first side 708 having a stepped configuration having a first surface 710 elevated with respect to a second surface 712. The first surface 710 and the second surface 712 include solder resist layers with SROs in the solder resist layers. A first set of contacts are located in the SROs. The first substrate 704 is oriented so that solder balls placed in the SROs remain in the SROs due to gravity.

Stage 2 illustrates a state after a first set of solder balls 714 are positioned on contacts in SROs in the first surface 710. The solder balls 714 have a first characteristic dimension.

Stage 3 illustrates a state after a second set of solder balls 716 are positioned on contacts in SROs in the second surface 712. The solder balls 716 have a second characteristic dimension that is larger than the first characteristic dimension of the first solder balls 714.

Stage 4 of FIG. 7 illustrates a block diagram of a state after a first reflow process is used to connect the solder balls 714 of the first set and the solder balls 716 of the second set to corresponding contacts to produce the IC device 702. After the reflow process, distal ends of solder balls 714 of the first set are coplanar, or substantially coplanar within an acceptable error margin, with distal ends of solder balls 716 of the second set. Should the distal ends of the solder balls 714, 716 not be coplanar within the acceptable error margin associated with coplanarity, distal ends of particular solder balls that extend past distal ends of other solder balls can be subjected to a process (e.g., grinding) to make the distal ends of the solder balls 714, 716 coplanar or within the acceptable error margin for coplanarity. Subsequent to Stage 4, additional operations may be performed to connect the IC device 702 to a second substrate (e.g., a printed circuit board) to form a portion of a device, connect a second IC device to a second substrate of the first IC device, or combinations thereof, which may result in the device depicted in FIG. 5.

Figure 8:
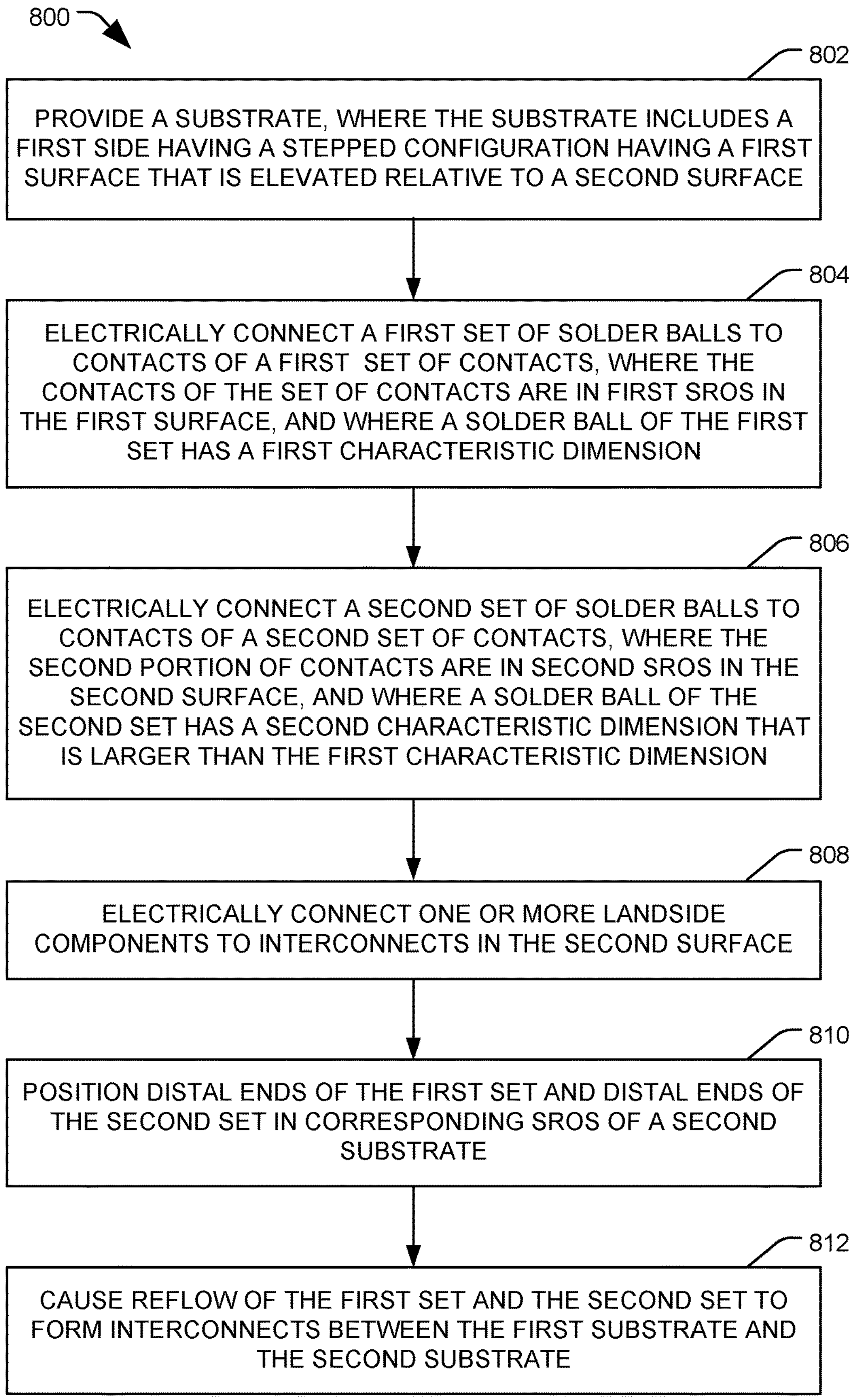
FIG. 8 illustrates an exemplary flow diagram of a method for fabricating an IC device.

Exemplary Flow Diagram of a Method for Fabricating an IC Device Having a Substrate With a Stepped Configuration to Accommodate at Least Two Different Solder Ball Sizes In some implementations, fabricating an IC device having a substrate with a stepped configuration to accommodate at least two different solder ball sizes includes several processes. The substrate may be a component of an IC device with a first side configured to couple to a second IC device or a circuit board and a second side electrically connected to one or more ICs, or the substrate may be a portion of a circuit board configured to be connected to another substrate connected to at least one IC to form the IC device. FIG. 8 illustrates an exemplary flow diagram of a method 800 for providing or fabricating the IC device having a substrate with a stepped configuration to accommodate at least two different solder ball sizes. In some implementations, the method 800 may be used to provide or fabricate an IC device 402, 502, 602, 702 with any of the substrates 104, 204, 304, 408, 410, 440, 604, 614, 704 depicted in FIGS. 1A-7.

It should be noted that the method 800 of FIG. 8 may combine one or more processes in order to simplify and/or clarify the method for providing or fabricating the IC device. In some implementations, the order of the processes may be changed or modified.

The method 800 includes, at block 802, providing a substrate of an integrated circuit device. The substrate includes a first side having a stepped configuration having a first surface elevated relative to a second surface. For example, the substrate may be the substrate 104 of FIG. 1A and FIG. 1B in which the substrate 104 has a first surface 106 that is elevated relative to a second surface 108; may be the substrate of FIG. 2 in which the surface 208 is elevated relative to surfaces 206, 210; may be the substrate 304 of FIG. 3 in which the first surface 306 is elevated relative to the second surface 308; may be the substrate 408 of FIG. 4 and FIG. 5 in which the first surface 422 is elevated relative to the second surface 424; may be the substrate 604 in which the first surface 608 is elevated relative to the second surface 610; or may be the substrate 704 of FIG. 7 in which the first surface 710 is elevated relative to the second surface 712.

The method 800 includes, at block 804, electrically connecting a first set of solder balls to contacts of a first set of contacts. The first set of contacts are contacts in first SROs in the first surface. A solder ball of the first set has a first characteristic dimension. For example, the solder balls of the first set of solder balls may be the solder balls 310 of FIG. 3, may be the solder balls 426 of FIG. 4 and FIG. 5, or may be the solder balls 714 of FIG. 7. The contacts may be contacts 116A of FIG. 1A or contacts 218B of FIG. 2. The first SROs may be SROs 112 of FIG. 1A or SROs 214 of FIG. 2.

Electrically connecting the first set to the first portion of contacts includes placing the first set of solder balls in the first SROs and subjecting the first set of solder balls to a reflow process to connect the first set to the first portion of contacts. The first SROs are arranged on the first surface in a first pattern having a first pitch distance between centers of the first SROs.

The method 800 includes, at block 806, electrically connecting a second set of solder balls to contacts of a second set of contacts. The second set of contacts are contacts in second SROs in the second surface. A solder ball of the second set has a second characteristic dimension that is larger than the first characteristic dimension. For example, the solder balls of the second set of solder balls may be the solder balls 312 of FIG. 3, the solder balls 428 of FIG. 4, or the solder balls 716 of FIG. 7. The contacts may be contacts 116B of FIG. 1A and FIG. 1B, or contacts 218A or 218C of FIG. 2. The second SROs may be SROs 114 of FIG. 1A and FIG. 1B, or SROs 212 or 216 of FIG. 2.

Electrically connecting the second set of solder balls to the second set of contacts includes placing the second set of solder balls in the second SROs and subjecting the second set of solder balls to a reflow process to electrically connect the second set of solder balls to the second set of contacts. A single reflow process may be used to connect the first set of solder balls to the first set of contacts and the second set of solder balls to the second set of contacts. The second SROs are arranged on the second surface in a second pattern having a second pitch distance between centers of the second SROs. The first pitch distance may be smaller than the second pitch distance so that more solder balls are connected to contacts in the substrate than if only the second pitch distance was utilized for both the first SROs and the second SROs.

Optionally, the method 800, at block 808, includes electrically connecting one or more LSCs to interconnects in the second surface. For example, LSC 314 of FIG. 3 may be electrically connected to one or more interconnects in the second surface 308.

In some implementations, electrically connecting the first set of solder balls to the first set of contacts and the second set of solder balls to the second set of contacts produces the integrated circuit device and optionally electrically connecting one or more LSCs to interconnects in the second surface of the substrate produces the integrated circuit device, and the method 800 ends. For example, electrically connecting the solder balls 426 and the solder balls 428 of FIG. 4 to corresponding contacts produces the IC device 402. As a further example, electrically connecting the solder balls 426 and the solder balls 428 of FIG. 5 to corresponding contacts produces the IC device 502.

In other implementations, electrically connecting the first set of solder balls to the first set of contacts of a substrate and the second set of solder balls to the second set of contacts of the substrate and optionally electrically connecting one or more LSCs to interconnects in the second surface of the substrate does not produce an IC device because no IC is electrically connected to the substrate, and the method 800 continues to block 810. The method 800, at block 810, includes positioning distal ends of the first set of solder balls and distal ends of the second set of solder balls in corresponding SROs of a second substrate. For example, distal ends of the first set of solder balls and the second set of solder balls subjected to a reflow process to form the interconnects 618, 620 of FIG. 6 are positioned in the corresponding SROs in the first side 612 of the substrate 614 of FIG. 6. The method 800, at block 812, includes causing reflow of the first set of solder balls and the second set of solder balls to form interconnections between the first set of contacts of the substrate and a second set of contacts of the second substrate. For example, a reflow process causes reflow of the first set of solder balls and the second set of solder balls positioned in the SROs in the first side of the substrate 614 to form the interconnects 618, 620 of FIG. 6.

Exemplary Electronic Devices

Figure 9:
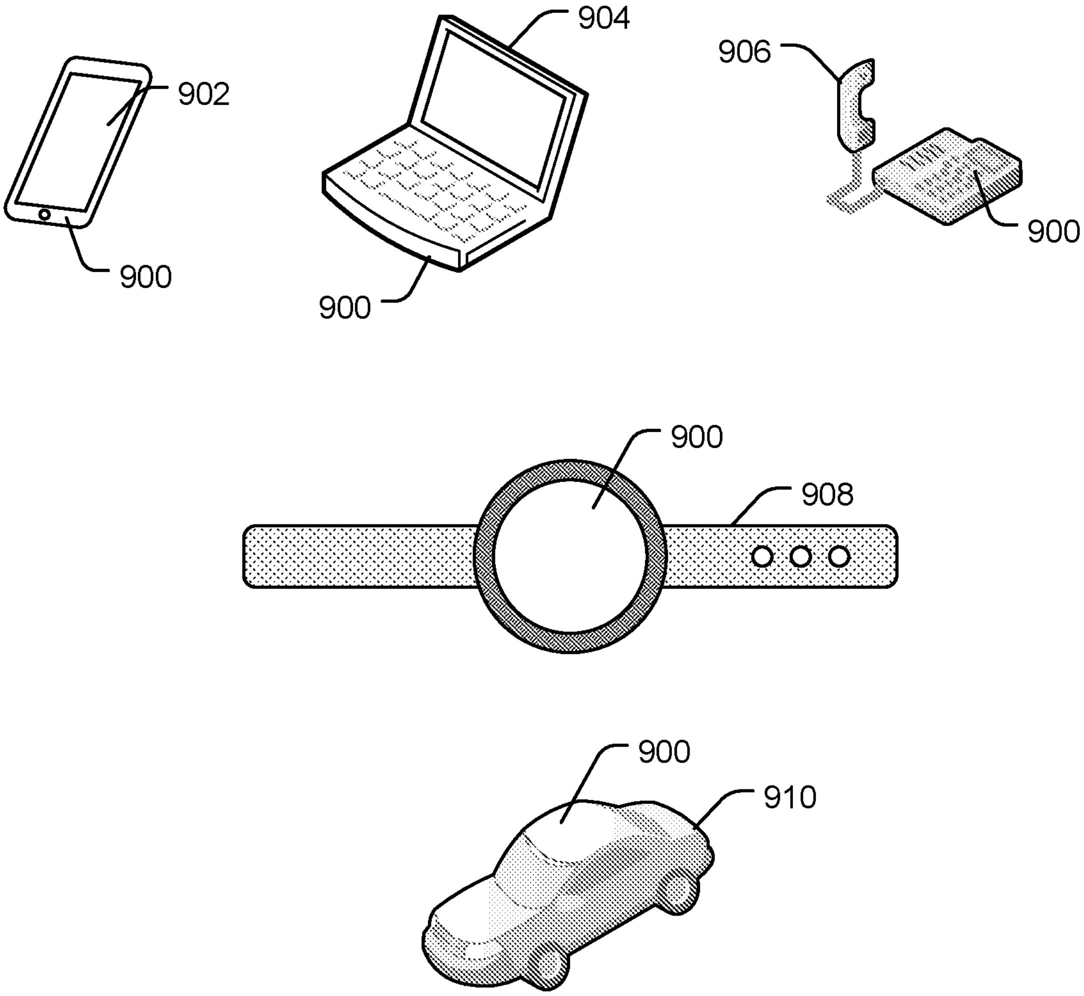
FIG. 9 illustrates various electronic devices that may integrate a die, an electronic circuit, an integrated device, an integrated passive device (IPD), a passive component, a package, and/or a device package described herein.

FIG. 9 illustrates various electronic devices that may include or be integrated with any of the IC devices 402, 602, 702 with any of the substrates 104, 204, 304, 408, 410, 440, 604, 704. For example, a mobile phone device 902, a laptop computer device 904, a fixed location terminal device 906, a wearable device 908, or a vehicle 910 (e.g., an automobile or an aerial device) may include a device 900. The device 900 can include, for example, any of the IC devices 402, 602, 702 with any of the substrates 104, 204, 304, 408, 410, 440, 604, 704 described herein. The devices 902, 904, 906 and 908 and the vehicle 910 illustrated in FIG. 9 are merely exemplary. Other electronic devices may also feature the device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1-9 may be rearranged and/or combined into a single component, process, feature or function or embodied in several components, processes, or functions. Additional elements, components, processes, and/or functions may also be added without departing from the disclosure. It should also be noted FIGS. 1-9 and its corresponding description in the present disclosure is not limited to dies and/or ICs. In some implementations, FIGS. 1-9 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word “exemplary” is used herein to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage or mode of operation. The term “coupled” is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term “electrically coupled” may mean that two objects are directly or indirectly coupled together such that an electrical current (e.g., signal, power, ground) may travel between the two objects. Two objects that are electrically coupled may or may not have an electrical current traveling between the two objects. The use of the terms “first”, “second”, “third” and “fourth” (and/or anything above fourth) is arbitrary. Any of the components described may be the first component, the second component, the third component or the fourth component. For example, a component that is referred to as a second component, may be the first component, the second component, the third component or the fourth component. The terms “encapsulate”, “encapsulating” and/or any derivation means that the object may partially encapsulate or completely encapsulate another object. The terms “top” and “bottom” are arbitrary. A component that is located on top may be located over a component that is located on a bottom. A top component may be considered a bottom component, and vice versa. As described in the disclosure, a first component that is located “over” a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term “over” as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located “in” a second component may be partially located in the second component or completely located in the second component. A value that is about X-XX, may mean a value that is between X and XX, inclusive of X and XX. The value(s) between X and XX may be discrete or continuous. The term “about ‘value X’”, or “approximately value X”, as used in the disclosure means within 10 percent of the ‘value X’. For example, a value of about 1 or approximately 1, would mean a value in a range of 0.9-1.1. A “plurality” of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect, or an interconnection. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, an IC device includes a substrate comprising a first side having a stepped configuration having a first surface that is elevated relative to a second surface. The IC device includes a first set of solder balls electrically connected to a first set of contacts in first solder resist openings (SROs) in the first surface, wherein a solder ball of the first set of solder balls has a first characteristic dimension. The IC device also includes a second set of solder balls electrically connected to a second set of contacts in second SROs in the second surface, wherein a solder ball of the second set of solder balls has a second characteristic dimension larger than the first characteristic dimension.

Example 2 includes the IC device of claim 1, wherein the first set of solder balls comprise a first ball grid array, and wherein the second set of solder balls comprise a second ball grid array.

Example 3 includes the IC device of Example 1 or Example 2, wherein distal ends of solder balls of the first set of solder balls are coplanar with distal ends of solder balls of the second set of solder balls.

Example 4 includes the IC device of Example 3, wherein sizes of solder balls of the first set of solder balls and the second set of solder balls and sizes of the first SROs and the second SROs facilitate coplanarity of the distal ends of solder balls of the first set of solder balls with the distal ends of solder balls of the second set of solder balls.

Example 5 includes the IC device of any of Example 1 to Example 4, further comprising at least one LSC electrically connected to one or more interconnects in the second surface.

Example 6 includes the IC device of Example 5, wherein the LSC comprises a capacitor.

Example 7 includes the IC device of any of Example 1 to Example 6, wherein centers of adjacent first SROs are separated by a first pitch distance, and wherein centers of adjacent second SROs are separated by a second pitch distance larger than the first pitch distance.

Example 8 includes the IC device of any of Example 1 to Example 7, further comprising a circuit board electrically connected to the substrate via the first set of solder balls and the second set of solder balls.

Example 9 includes the IC device of any of Example 1 to Example 7, further comprising a second IC device electrically connected to the first set of solder balls and the second set of solder balls.

Example 10 includes the IC device of any of Example 1 to Example 9, wherein the first surface is disposed about a perimeter of the second surface.

Example 11 includes the IC device of Example 10, further comprising a die electrically coupled to a second side of the substrate, wherein the second surface is located in a die shadow of the die.

Example 12 includes the IC device of Example 11, wherein at least one solder ball of the second set of solder balls is electrically connected to a power delivery network configured to provide power to the die.

Example 13 includes the IC device of any of Example 10 to Example 12, wherein at least one solder ball of the second set of solder balls is an I/O interconnection.

Example 14 includes the IC device of any of Example 1 to Example 9, wherein the second surface is disposed about a perimeter of the first surface.

Example 15 includes the IC device of any of Example 1 to Example 14, wherein the substrate comprises a first count of metal layers between a second side of the substrate and the first surface of the first side, wherein the substrate comprises a second count of metal layers between the second side and the second surface of the first side, and wherein the first count is greater than the second count.

According to Example 16, a device includes a substrate comprising a first side having a stepped configuration having a first surface that is elevated relative to a second surface. The device includes a first set of solder balls electrically connected to a first set of contacts in first solder resist openings (SROs) in the first surface, wherein a solder ball of the first set of solder balls has a first characteristic dimension. The device includes a second set of solder balls electrically connected to a second set of contacts in second SROs in the second surface, wherein a solder ball of the second set of solder balls has a second characteristic dimension larger than the first characteristic dimension. The device includes a die electrically connected to a second side of the substrate. The device includes a mold compound coupled to the second side and at least partially encapsulating the die. The device also includes a second substrate coupled to the mold compound, wherein the second substrate comprises a third set of contacts configured to be electrically connected to a fourth set of contacts of a second device.

Example 17 includes the device of Example 16, wherein centers of adjacent first SROs are separated by a first pitch distance, and wherein centers of adjacent second SROs are separated by a second pitch distance larger than the first pitch distance.

Example 18 includes the device of Example 16 or Example 17, further comprising the second device electrically connected to the third set of contacts of the second substrate, wherein the second device comprises DRAM.

Example 19 includes the device of any of Example 16 to Example 18, further comprising a circuit board electrically connected to the substrate via interconnections formed by solder balls of the first set of solder balls and the second set of solder balls.

Example 20 includes the device of any of Example 16 to Example 19, wherein distal ends of solder balls of the first set of solder balls are coplanar with distal ends of solder balls of the second set of solder balls.

Example 21 includes the device of any of Example 16 to Example 20, wherein the first surface is disposed around a perimeter of the second surface.

Example 22 includes the device of any of Example 16 to Example 20, wherein the second surface is disposed around a perimeter of the first surface.

Example 23 includes the device of any of Example 16 to Example 22, further comprising at least one landside component (LSC) electrically connected to the second surface.

According to Example 24, a method of fabricating an integrated circuit (IC) device includes providing a substrate, wherein the substrate comprises a first side having a stepped configuration having a first surface that is elevated relative to a second surface. The method includes electrically connecting a first set of solder balls to a first set of contacts in first solder resist openings (SROs) in the first surface, wherein a solder ball of the first set of solder balls has a first characteristic dimension. The method also includes electrically connecting a second set of solder balls to a second set of contacts in second SROs in the second surface, wherein a solder ball of the second set of solder balls has a second characteristic dimension larger than the first characteristic dimension.

Example 25 includes the method of Example 24, wherein said electrically connecting the first set of solder balls to the first set of contacts and said electrically connecting the second set of solder balls to the second set of contacts comprises: positioning the first set of solder balls in the first SROs; positioning the second set of solder balls in the second SROs; and causing reflow of the first set of solder balls and the second set of solder balls.

Example 26 includes the method of Example 25, wherein sizes of solder balls of the first set of solder balls and the second set of solder balls and sizes of the first SROs and the second SROs facilitate coplanarity of distal ends of solder balls of the first set of solder balls with distal ends of solder balls of the second set of solder balls after reflow of the first set of solder balls and the second set of solder balls.

Example 27 includes the method of any of Example 24 to Example 26, further comprising electrically connecting a landside component (LSC) to interconnects in the second surface.

Example 28 includes the method of any of Example 24 to Example 27, wherein centers of adjacent first SROs are separated by a first pitch distance, and wherein centers of adjacent second SROs are separated by a second pitch distance that is larger than the first pitch distance.

Example 29 includes the method of any of Example 24 to Example 28, wherein a die is electrically connected to a second side of the substrate.

Example 30 includes the method of Example 29, wherein the second surface is located in a die shadow of the die.

Example 31 includes the method of Example 29 or Example 30, wherein the die is at least partially encapsulated in mold compound.

Example 32 includes the method of Example 31, wherein a second substrate is coupled to the mold compound, and wherein the second substrate is configured to be electrically connected to a second IC device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated circuit (IC) device comprising:

a first substrate comprising a first side having a stepped configuration having a first surface that is elevated relative to a second surface and a second side opposite the first side;

a first set of solder balls electrically coupled to a first set of contacts in first solder resist openings (SROs) in the first surface and configured to electrically couple to a second substrate, wherein a solder ball of the first set of solder balls has a first characteristic dimension;

a second set of solder balls electrically coupled to a second set of contacts in second SROs in the second surface and configured to electrically couple to the second substrate, wherein a solder ball of the second set of solder balls has a second characteristic dimension larger than the first characteristic dimension; and first interconnects external to the first substrate and distinct from the first set of solder balls and the second set of solder balls, wherein the first interconnects are electrically coupled to the second side and configured to electrically couple to a third substrate.

2. The IC device of claim 1, wherein distal ends of solder balls of the first set of solder balls are coplanar with distal ends of solder balls of the second set of solder balls.

3. The IC device of claim 2, wherein sizes of solder balls of the first set of solder balls and the second set of solder balls and sizes of the first SROs and the second SROs facilitate coplanarity of the distal ends of solder balls of the first set of solder balls with the distal ends of solder balls of the second set of solder balls.

4. The IC device of claim 1, further comprising at least one landside component (LSC) electrically coupled to one or more interconnects in the second surface.

5. The IC device of claim 1, wherein centers of adjacent first SROs are separated by a first pitch distance, and wherein centers of adjacent second SROs are separated by a second pitch distance larger than the first pitch distance.

6. The IC device of claim 1, further comprising a circuit board electrically coupled to the first side of the first substrate via the first set of solder balls and the second set of solder balls.

7. The IC device of claim 1, wherein the first side includes a third surface, and wherein the second surface is elevated relative to the third surface.

8. The IC device of claim 1, wherein the first surface is disposed about a perimeter of the second surface.

9. The IC device of claim 8, further comprising a die electrically coupled to the second side of the first substrate between the first interconnects, wherein the second surface is located in a die shadow of the die.

10. The IC device of claim 9, wherein at least one solder ball of the second set of solder balls is electrically coupled to a power delivery network configured to provide power to the die.

11. The IC device of claim 9, wherein at least one solder ball of the second set of solder balls is an input/output (I/O) interconnection.

12. The IC device of claim 1, wherein the second surface is disposed about a perimeter of the first surface.

13. The IC device of claim 1, wherein the first substrate comprises a first count of metal layers between the second side of the first substrate and the first surface of the first side, wherein the first substrate comprises a second count of metal layers between the second side and the second surface of the first side, and wherein the first count is greater than the second count.

14. A device comprising:

a first substrate comprising a first side having a stepped configuration having a first surface that is elevated relative to a second surface and a second side opposite the first side;

a first set of solder balls electrically coupled to a first set of contacts in first solder resist openings (SROs) in the first surface and configured to electrically couple to a second substrate, wherein a solder ball of the first set of solder balls has a first characteristic dimension;

a second set of solder balls electrically coupled to a second set of contacts in second SROs in the second surface and configured to electrically couple to the second substrate, wherein a solder ball of the second set of solder balls has a second characteristic dimension larger than the first characteristic dimension;

a die electrically coupled by second interconnects directly to a second side of the first substrate;

a mold compound coupled to the second side and at least partially encapsulating the die; and a third substrate coupled to the mold compound, wherein the die is positioned between the first substrate and the third substrate, and wherein first interconnects external to the first substrate and distinct from the first set of solder balls and the second set of solder balls are electrically coupled to the second side of the first substrate and to the third substrate.

15. The device of claim 14, wherein centers of adjacent first SROs are separated by a first pitch distance, and wherein centers of adjacent second SROs are separated by a second pitch distance larger than the first pitch distance.

16. The device of claim 14, further comprising a second device electrically coupled to a third set of contacts of the third substrate, wherein the second device comprises dynamic random-access memory (DRAM).

17. The device of claim 14, wherein the second substrate comprises a circuit board electrically coupled to the first substrate via interconnections formed by solder balls of the first set of solder balls and the second set of solder balls.

18. The device of claim 14, wherein distal ends of solder balls of the first set of solder balls are coplanar with distal ends of solder balls of the second set of solder balls.

19. The device of claim 14, wherein the first surface is disposed around a perimeter of the second surface.

20. The device of claim 14, wherein the second surface is disposed around a perimeter of the first surface.

21. The device of claim 14, further comprising at least one landside component (LSC) electrically coupled to the second surface.

22. A method of fabricating an integrated circuit (IC) device comprising:

providing a first substrate, wherein the first substrate comprises a first side having a stepped configuration having a first surface that is elevated relative to a second surface and a second side opposite the first side;

electrically coupling a first set of solder balls to a first set of contacts in first solder resist openings (SROs) in the first surface, wherein the first set of solder balls are configured to electrically couple to a second substrate, and wherein a solder ball of the first set of solder balls has a first characteristic dimension;

electrically coupling a second set of solder balls to a second set of contacts in second SROs in the second surface, wherein the second set of solder balls are configured to electrically couple to the second substrate, and wherein a solder ball of the second set of solder balls has a second characteristic dimension larger than the first characteristic dimension; and electrically coupling first interconnects to the second side, wherein the first interconnects are external to the first substrate and distinct from the first set of solder balls and the second set of solder balls, and wherein the first interconnects are configured to electrically couple to a third substrate.

23. The method of claim 22, wherein said electrically coupling the first set of solder balls to the first set of contacts and said electrically coupling the second set of solder balls to the second set of contacts comprises:

positioning the first set of solder balls in the first SROs;

positioning the second set of solder balls in the second SROs; and causing reflow of the first set of solder balls and the second set of solder balls.

24. The method of claim 23, wherein sizes of solder balls of the first set of solder balls and the second set of solder balls and sizes of the first SROs and the second SROs facilitate coplanarity of distal ends of solder balls of the first set of solder balls with distal ends of solder balls of the second set of solder balls after reflow of the first set of solder balls and the second set of solder balls.

25. The method of claim 22, further comprising electrically coupling a landside component (LSC) to interconnects in the second surface.

26. The method of claim 22, wherein centers of adjacent first SROs are separated by a first pitch distance, and wherein centers of adjacent second SROs are separated by a second pitch distance that is larger than the first pitch distance.

27. The method of claim 22, wherein a die is electrically coupled to a second side of the first substrate.

28. The method of claim 27, wherein the second surface is located in a die shadow of the die.

29. The method of claim 27, wherein the die is at least partially encapsulated in mold compound.

30. The method of claim 29, wherein the third substrate is coupled to the mold compound.

* * * * *